United States Patent
Chen et al.

(10) Patent No.: US 10,804,923 B2
(45) Date of Patent: Oct. 13, 2020

(54) SUPERPOSITION OPERATION CIRCUIT AND FLOAT-VOLTAGE DIGITAL-TO-ANALOG CONVERSION CIRCUIT

(71) Applicant: Huawei Technologies Co., Ltd., Shenzhen (CN)

(72) Inventors: Yue Chen, Chengdu (CN); Liang Chen, Shenzhen (CN); Jiake Wang, Shenzhen (CN)

(73) Assignee: HUAWEI TECHNOLOGIES CO., LTD, Shenzhen (CN)

( * ) Notice: Subject to any disclaimer, the term of this patent is extended or adjusted under 35 U.S.C. 154(b) by 0 days.

(21) Appl. No.: 16/677,810

(22) Filed: Nov. 8, 2019

(65) Prior Publication Data

US 2020/0076445 A1    Mar. 5, 2020

Related U.S. Application Data

(63) Continuation of application No. PCT/CN2018/084320, filed on Apr. 25, 2018.

(30) Foreign Application Priority Data

May 8, 2017   (CN) .......................... 2017 1 0317131

(51) Int. Cl.
  *H03M 1/66*   (2006.01)
  *H03F 1/02*   (2006.01)
  *H03F 3/45*   (2006.01)

(52) U.S. Cl.
  CPC ............ *H03M 1/66* (2013.01); *H03F 1/0205* (2013.01); *H03F 3/45* (2013.01)

(58) Field of Classification Search
  CPC ...... H03M 1/66; H03M 1/662; H03M 1/0604; H03F 1/0205; H03F 3/45;
  (Continued)

(56) References Cited

U.S. PATENT DOCUMENTS 8,089,384 B1 *   1/2012   Williams ............... H03M 1/005
                                                                 341/136
8,570,199 B2 *  10/2013   Cyrusian ............. H03M 1/0845
                                                                 341/118
(Continued)

FOREIGN PATENT DOCUMENTS

CN      1839541 A      9/2006
CN    200966033 Y     10/2007
(Continued)

OTHER PUBLICATIONS

Machine Translation and Abstract of Chinese Publication No. CN101694963, Apr. 14, 2010, 17 pages.

(Continued)

*Primary Examiner* — Khai M Nguyen
(74) *Attorney, Agent, or Firm* — Conley Rose, P.C.

(57) ABSTRACT

A superposition operation circuit and a float-voltage digital-to-analog conversion circuit to superpose analog elements according to an indirect current superposition principle, where a voltage follower is implemented using a first operational amplifier such that an output end of the voltage follower is clamped to a voltage that is input to a positive-phase input end, namely, a to-be-superposed analog element. Then a current generation circuit converts a voltage signal to a current signal, a voltage drop for the current signal is generated on a first resistor coupled to an output end of the first operational amplifier, and the voltage drop is superposed on a voltage signal output by the first operational amplifier.

20 Claims, 4 Drawing Sheets

(58) Field of Classification Search
CPC ...... H03F 2203/45356; H03F 3/45273; H03K 19/0013; H03K 19/0016; H03K 19/20
USPC .......................................... 341/135–136, 144
See application file for complete search history.

(56) References Cited

U.S. PATENT DOCUMENTS

| | | | |
|---|---|---|---|
| 2004/0263233 | A1 | 12/2004 | Dupuy et al. |
| 2012/0025064 | A1 | 2/2012 | Koyama et al. |

FOREIGN PATENT DOCUMENTS

| | | | |
|---|---|---|---|
| CN | 201294673 | Y | 8/2009 |
| CN | 101694963 | A | 4/2010 |
| CN | 201622488 | U | 11/2010 |
| CN | 102437839 | A | 5/2012 |
| CN | 102541149 | A | 7/2012 |
| CN | 102692883 | A | 9/2012 |
| CN | 103474015 | A | 12/2013 |
| CN | 104536510 | A | 4/2015 |
| CN | 104714456 | A | 6/2015 |
| CN | 105139803 | A | 12/2015 |
| CN | 205352566 | U | 6/2016 |
| CN | 107425845 | A | 12/2017 |
| EP | 3584935 | A1 | 12/2019 |
| JP | 2009153097 | A | 7/2009 |

OTHER PUBLICATIONS

Machine Translation and Abstract of Chinese Publication No. CN102437839, May 2, 20212, 19 pages.
Machine Translation and Abstract of Chinese Publication No. CN102541149, Jul. 4, 2012, 22 pages.
Machine Translation and Abstract of Chinese Publication No. CN102692883, Sep. 26, 2012, 11 pages.
Machine Translation and Abstract of Chinese Publication No. CN103474015, Dec. 25, 2013, 29 pages.
Machine Translation and Abstract of Chinese Publication No. CN104536510, Apr. 22, 2015, 11 pages.
Machine Translation and Abstract of Chinese Publication No. CN104714456, Jun. 17, 2015, 10 pages.
Machine Translation and Abstract of Chinese Publication No. CN105139803, Dec. 9, 2015, 17 pages.
Machine Translation and Abstract of Chinese Publication No. CN200966033, Oct. 24, 2007, 5 pages.
Machine Translation and Abstract of Chinese Publication No. CN201294673, Aug. 19, 2009, 9 pages.
Machine Translation and Abstract of Chinese Publication No. CN201622488, Nov. 3, 2010, 5 pages.
Machine Translation and Abstract of Chinese Publication No. CN205352566, Jun. 29, 2016, 7 pages.
Machine Translation and Abstract of Japanese Publication No. JP2009153097, Jul. 9, 2009, 63 pages.
Cheng, L., et al., "Fundamentals of Analog Electronic Technology (2nd Edition)," Jan. 31, 2015, 29 pages.

* cited by examiner

SUPERPOSITION OPERATION CIRCUIT AND FLOAT-VOLTAGE DIGITAL-TO-ANALOG CONVERSION CIRCUIT

CROSS-REFERENCE TO RELATED APPLICATIONS

This application is a continuation application of International Patent Application No. PCT/CN2018/084320 filed on Apr. 25, 2018, which claims priority to Chinese Patent Application No. 201710317131.6 filed on May 8, 2017. The disclosures of the aforementioned applications are hereby incorporated by reference in their entireties.

TECHNICAL FIELD

The present disclosure belongs to the field of electronic technologies, and in particular, to a superposition operation circuit and a float-voltage digital-to-analog conversion circuit.

BACKGROUND

During application of electronic control, in most cases, a digital control analog element needs to be superposed on another analog element for adjustment. The digital control analog element may be obtained by a digital-to-analog converter (DAC). FIG. 1 is a schematic diagram in which an analog element A needs to be superposed on an analog element B. As shown in FIG. 1, after receiving a digital control signal, a DAC generates a corresponding analog element A, and a superposition operation circuit superposes the analog element on a to-be-superposed analog element B to obtain a final signal C required in application, that is, C=A+B.

The superposition operation circuit is usually implemented using an operational amplifier, and the digital control analog element may be a voltage analog element or a current analog element. The following separately describes, with reference to FIG. 2 to FIG. 4, an operation principle for superposing a superposed signal on two different types of control analog elements. FIG. 2 is a schematic diagram of a conventional direct voltage superposition manner. FIG. 3 is an equivalent schematic diagram of an operational amplifier in FIG. 2. FIG. 4 is a schematic diagram of a conventional indirect current superposition manner.

As shown in FIG. 2, a dual-input operational amplifier directly superposes an analog element $V_{DAC}$ of a digital control signal on a to-be-superposed analog element $V_S$. In the dual-input operational amplifier, the analog element $V_{DAC}$ is input to one pair of input ends, and at the other pair of input ends, the to-be-superposed analog signal $V_S$ is input to a positive phase, and a negative phase is connected to an output end $V_O$. As shown in FIG. 3, metal-oxide-semiconductor (MOS) transistors controlled by each pair of inputs $V_+$ and $V_-$ of an operational amplifier may be equivalent to one voltage-controlled current source, and an output voltage is a voltage drop generated after a current generated by the controlled current source passes through a resistor. Therefore, the output of the dual-input operational amplifier is shown in Formula 1:

$$V_O = [gm_1 \times V_{DAC} + gm_2 \times (V_S - V_O)] \times R \quad \text{(Formula 1)}.$$

In Formula 1, $gm_1$ indicates a gain of MOS transistors controlled by a first pair of input ends, $gm_2$ indicates a gain of MOS transistors controlled by a second pair of input ends, and R is resistance of an equivalent resistor.

If Formula 1 meets a linearity requirement $V_O \approx V_{DAC} + V_S$, $gm_1 = gm_2$ needs to be met. However, gm of an actual device is related to an input voltage of the device. In an embodiment, $V_{DAC}$ is not equal to $V_S$, and a larger difference between $V_{DAC}$ and $V_S$ leads to a larger error between $gm_1$ and $gm_2$ and severer inconsistency between an actual output and $V_O \approx V_{DAC} + V_S$. When an original error that $V_S$ is inconsistent with $V_{DAC}$ is ruled out, when $V_{DAC}$ changes greatly, an input voltage also greatly affects a status change of a MOS transistor, and the status change of the MOS transistor causes a change in gm. Consequently, a nonlinear error is caused to the to-be-superposed analog signal $V_S$. It can be learned that a voltage superposition circuit is simple and consumes low power, but can achieve relatively low absolute precision at a millivolt (mV) level.

As shown in FIG. 4, in an operational amplifier, a to-be-superposed signal $V_S$ is input to a positive-phase input end, and a negative-phase input end is connected to an output end. In this case, the output end $V_1$ of the operational amplifier is fixed at $V_S$, and an output at an upper end of a resistor is an output of an entire superposition operation circuit $V_O = V_1 + R \times I_{DAC} = V_S + R \times I_{DAC}$. In this superposition manner, the output of the operational amplifier is always fixed at $V_S$, and a work point is fixed, and therefore the output precision is relatively high. However, the current $I_{DAC}$ needs to be highly precise. In this case, providing a high-precision superposition operation circuit with a relatively low input signal precision requirement becomes a technical issue that urgently needs to be resolved.

SUMMARY

In view of this, an objective of the present disclosure is to provide a superposition operation amplification circuit and a float-voltage digital-to-analog conversion circuit in order to improve precision of an output signal of a superposition operation and lower an input signal precision requirement, without increasing power consumption of the superposition operation circuit.

According to a first aspect, this application provides a superposition operation circuit, including a current generation circuit and a first operational amplifier, where the current generation circuit includes a first input end, a second input end, and an output end, where a first voltage signal is input to the first input end, a second voltage signal is input to the second input end, and the current generation circuit is configured to convert the first voltage signal to a first current signal, convert the second voltage signal to a second current signal, and output a current difference between the first current signal and the second current signal through the output end, and a to-be-superposed analog element is input to a positive-phase input end of the first operational amplifier, a negative-phase input end of the first operational amplifier is connected to an output end of the first operational amplifier, the output end is connected to the output end of the current generation circuit using a first resistor, and the first operational amplifier is configured to superpose the to-be-superposed analog element on a voltage drop on the first resistor.

In a first possible implementation of the first aspect, the current generation circuit includes a first voltage-to-current conversion circuit, a second voltage-to-current conversion circuit, and a current replication circuit, the first voltage signal is input to a first voltage input end of the first voltage-to-current conversion circuit, and the first voltageto-current conversion circuit is configured to convert the first voltage signal to the first current signal and output the first current signal through a first current output end, the second voltage signal is input to a second voltage input end of the second voltage-to-current conversion circuit, and the second voltage-to-current conversion circuit is configured to convert the second voltage signal to the second current signal and output the second current signal through a second current output end, and an input end of the current replication circuit is connected to the second current output end, an output end of the current replication circuit is connected to the first current output end, and the current replication circuit is configured to reverse the second current signal and superpose the reversed second current signal on the first current signal to obtain the current difference.

In a second possible implementation of the first aspect, the first voltage-to-current conversion circuit includes a second operational amplifier, a first switching transistor, a second switching transistor, and a second resistor, the first voltage signal is input to a positive-phase input end of the second operational amplifier, an output end of the second operational amplifier is connected to a control end of the first switching transistor, and an output end of the first switching transistor is an output end of the first voltage-to-current conversion circuit, a control end of the second switching transistor is connected to the output end of the second operational amplifier, an output end of the second switching transistor is connected to a negative-phase input end of the second operational amplifier, and both an input end of the second switching transistor and an input end of the first switching transistor are connected to a power source, and the negative-phase input end of the second operational amplifier is connected to a ground terminal using the second resistor.

In a third possible implementation of the first aspect, the second voltage-to-current conversion circuit includes a third operational amplifier, a third switching transistor, a fourth switching transistor, and a third resistor, the second voltage signal is input to a positive-phase input end of the third operational amplifier, an output end of the third operational amplifier is connected to a control end of the third switching transistor, a negative-phase input end of the third operational amplifier is connected to an output end of the third switching transistor, and a negative-phase input end of the third switching transistor is connected to a ground terminal using the third resistor, and a control end of the fourth switching transistor is connected to the output end of the third operational amplifier, an output end of the fourth switching transistor is an output end of the second voltage-to-current conversion circuit, and input ends of the fourth switching transistor and the third switching transistor are connected to a power source.

In a fourth possible implementation of the first aspect, the current replication circuit is a standard current mirroring circuit including a fifth switching transistor and a sixth switching transistor, and a control end of the fifth switching transistor is connected to a control end of the sixth switching transistor, both an output end of the fifth switching transistor and an output end of the sixth switching transistor are connected to a ground terminal, an input end of the fifth switching transistor is connected to the control end of the fifth switching transistor, the input end of the fifth switching transistor is the input end of the current replication circuit, and an input end of the sixth switching transistor is the output end of the current replication circuit.

In a fifth possible implementation of the first aspect, the current generation circuit further includes a common-mode resistor, the negative-phase input end of the second operational amplifier is connected to a first end of the common-mode resistor using the second resistor, and a second end of the common-mode resistor is connected to a ground terminal, and the negative-phase input end of the third operational amplifier is connected to the first end of the common-mode resistor using the third resistor.

In a sixth possible implementation of the first aspect, both the first switching transistor and the second switching transistor are P-type MOS (also referred to as PMOS) field-effect transistors, or both the third switching transistor and the fourth switching transistor are P-type MOS transistors.

In a seventh possible implementation of the first aspect, both the fifth switching transistor and the sixth switching transistor are N-type MOS (also referred to as NMOS) transistors.

According to a second aspect, this application provides a float-voltage digital-to-analog conversion circuit, including a digital-to-analog conversion circuit and any superposition operation circuit provided in the first aspect, where a digital control signal is input to an input end of the digital-to-analog conversion circuit, a first output end of the digital-to-analog conversion circuit is connected to a first input end of the current generation circuit, a second output end of the digital-to-analog conversion circuit is connected to a second input end of the current generation circuit, and the digital-to-analog conversion circuit is configured to convert the digital control signal to the first voltage signal and the second voltage signal, and provide the first voltage signal and the second voltage signal for the current generation circuit in the superposition operation circuit.

According to the superposition operation circuit provided in this embodiment, analog elements are superposed according to an indirect current superposition principle. The negative-phase input end and the output end of the first operational amplifier are connected to each other such that the first operational amplifier has a feature of a voltage follower, and the output end of the first operational amplifier is clamped to a voltage that is input to the positive-phase input end, namely, a to-be-superposed analog element. Then the current generation circuit converts the voltage signal to the current signal, a voltage drop for the current signal is generated on the first resistor connected to the output end of the first operational amplifier, and the voltage drop is superposed on the voltage signal output by the first operational amplifier. It can be learned that, because an output work point of the first operational amplifier in the superposition operation circuit is always fixed at the to-be-superposed analog element, output precision of the operational amplifier is ensured. In addition, because a high-precision superposed current element is obtained by converting a low-absolute-precision voltage signal, but is not directly generated by a digital-to-analog conversion circuit, an input precision requirement for the current generation circuit is lowered, and then requirements for power consumption and an area of the current generation circuit are lowered.

BRIEF DESCRIPTION OF DRAWINGS

To describe the technical solutions in some of the embodiments of the present disclosure more clearly, the following briefly describes the accompanying drawings describing some of the embodiments. The accompanying drawings in the following descriptions show some embodiments of the present disclosure, and a person of ordinary skill in the art may still derive other drawings from these accompanying drawings without creative efforts.

DESCRIPTION OF EMBODIMENTS

Figure 1:
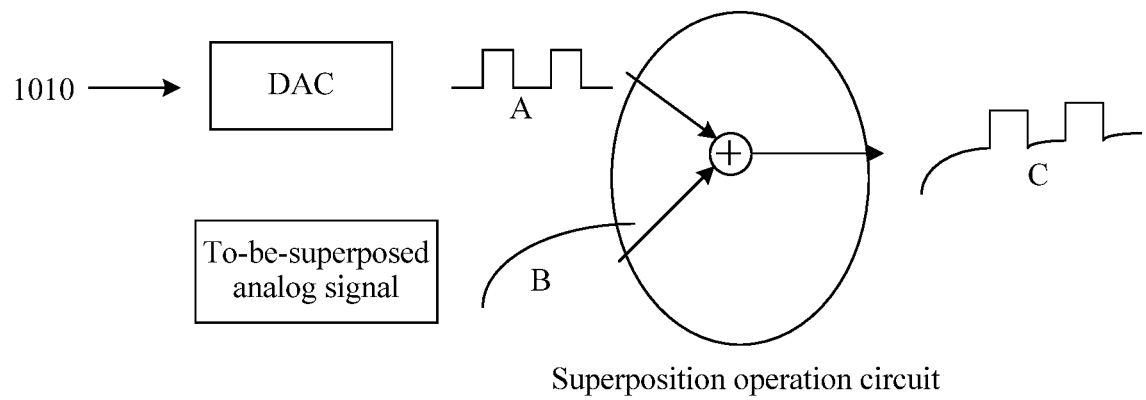
FIG. 1 is a schematic diagram of superposition of analog elements.
Figure 2:
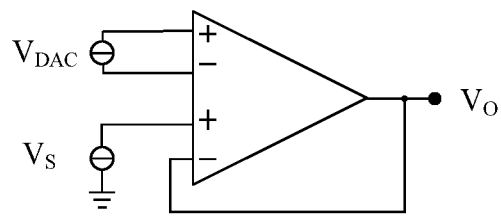
FIG. 2 is a schematic diagram of a circuit in which a conventional direct voltage superposition manner is used.
Figure 3:
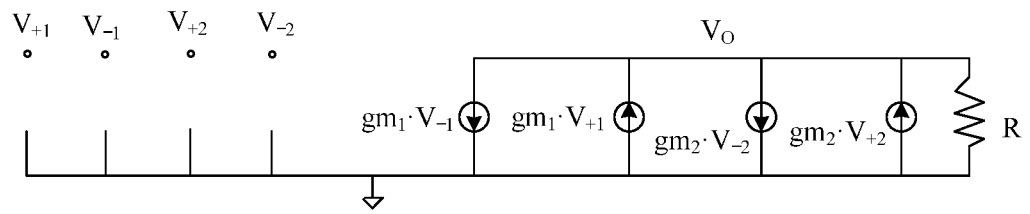
FIG. 3 is an equivalent schematic diagram of a dual-input operational amplifier.
Figure 4:
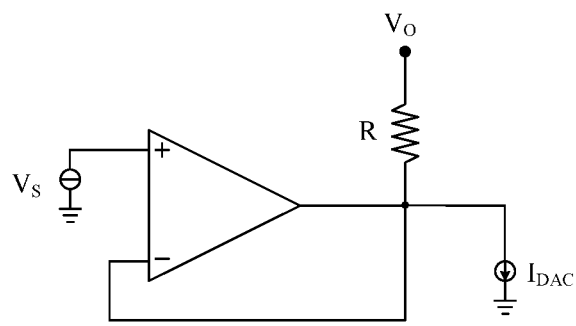
FIG. 4 is a schematic diagram of a circuit in which a conventional indirect current superposition manner is used.

In a direct voltage superposition manner shown in FIG. 2, due to a limitation of a parameter of an operational amplifier, relatively low absolute superposition precision at an mV level can be achieved. In an indirect current superposition manner shown in FIG. 4, high precision can be achieved, however, a high-precision current input is required. This application provides a superposition operation amplification circuit in which the indirect current superposition manner is used. Because an output end work point of an operational amplifier is always fixed at an input to-be-superposed analog element, output precision of the operational amplifier is ensured. In addition, because a high-precision superposed current element is obtained by a current generation circuit by converting an input low-absolute-precision voltage signal, but is not directly generated by a digital-to-analog conversion circuit, an input precision requirement for the current generation circuit is lowered, and then requirements for power consumption and an area of the current generation circuit are lowered. In this way, a high-precision superposition operation circuit with a relatively low input signal precision requirement is ultimately implemented.

Figure 5:
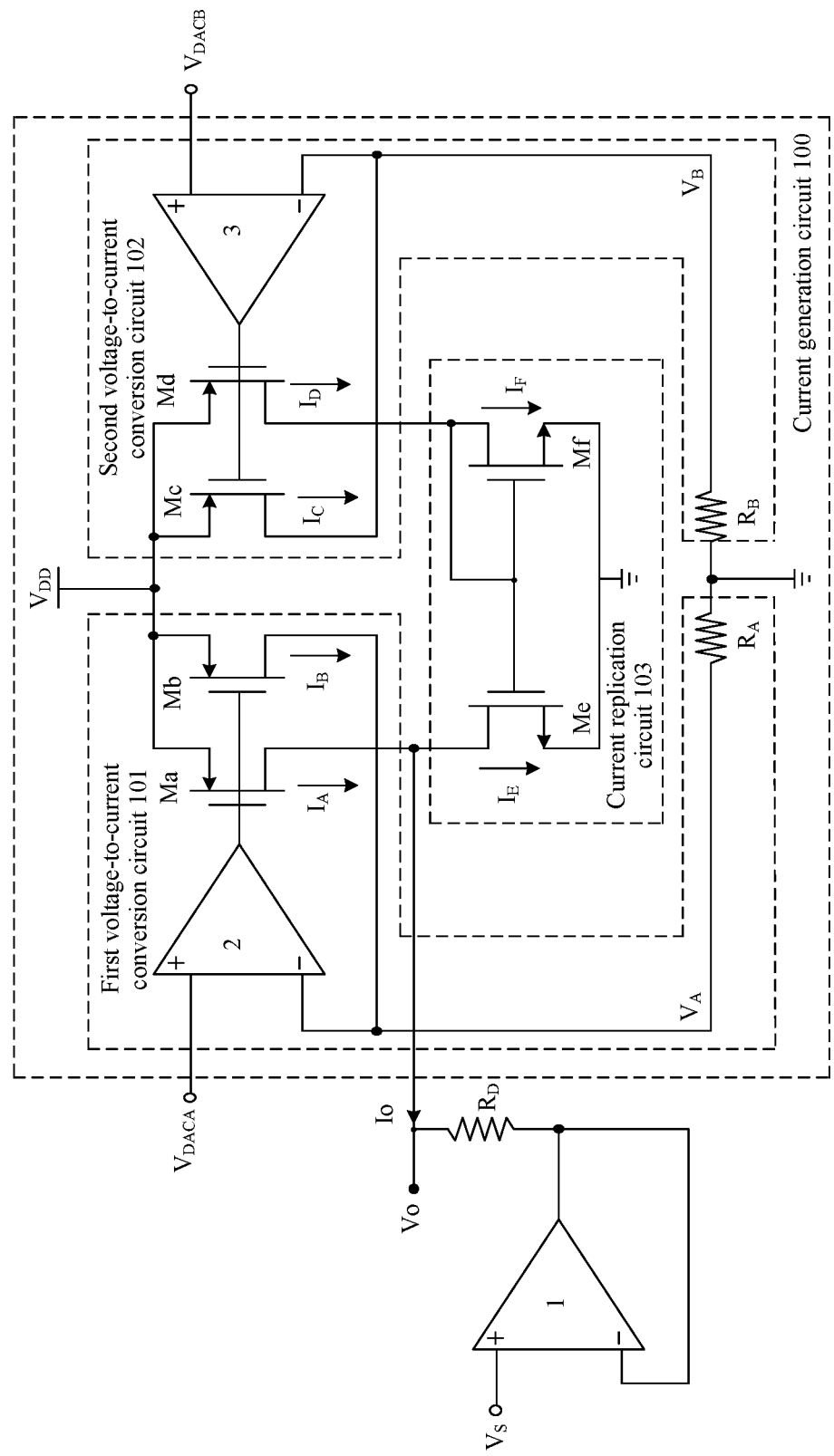
FIG. 5 is a schematic diagram of a superposition operation circuit according to an embodiment of this application.

FIG. 5 is a schematic circuit diagram of a superposition operation circuit according to an embodiment of this application. As shown in FIG. 5, the superposition operation circuit includes an operational amplifier 1 and a current generation circuit 100. The current generation circuit 100 includes a first voltage-to-current conversion circuit 101, a second voltage-to-current conversion circuit 102, and a current replication circuit 103.

In the operational amplifier 1, a to-be-superposed analog element $V_S$ is input to a positive-phase input end, a negative-phase input end is connected to an output end, and the output end of the operational amplifier 1 is connected to an output end of the current generation circuit 100 using a resistor $R_D$.

The current generation circuit 100 includes two input ends. A voltage signal $V_{DACA}$ is input to one input end, and a voltage signal $V_{DACB}$ is input to the other input end. The current generation circuit 100 is configured to separately convert $V_{DACA}$ and $V_{DACB}$ to current signals, and output a difference between the two current signals through the output end.

The first voltage-to-current conversion circuit 101 is configured to convert $V_{DACA}$ to a corresponding current signal, and includes an operational amplifier 2, switching transistors Ma and Mb, and a resistor $R_A$.

In an embodiment of this application, Ma and Mb are PMOS transistors. In the PMOS transistor, a source electrode is an input end, a drain electrode is an output end, and a gate electrode is a control end. In other embodiments of this application, Ma and Mb may be other types of switching transistors, and certainly, a corresponding schematic circuit diagram changes correspondingly. A person skilled in the art can derive a schematic circuit diagram corresponding to other types of switching transistors from this embodiment without creative efforts. Details are not described herein again.

The voltage signal $V_{DACA}$ is input to a positive-phase input end of the operational amplifier 2 that serves as an input end of the current generation circuit 100. A negative-phase input end of the operational amplifier 2 is connected to a drain electrode of Mb, and the negative-phase input end is grounded using $R_A$. An output end of the operational amplifier 2 is connected to gate electrodes of Ma and Mb, a drain electrode of Ma is connected to an output end of the current replication circuit 103, and source electrodes of Ma and Mb are connected to a power source $V_{DD}$.

The second voltage-to-current conversion circuit 102 is configured to convert $V_{DACB}$ to a corresponding current signal, and includes an operational amplifier 3, switching transistors Mc and Md, and a resistor $R_B$. Mc and Md are PMOS transistors. In the PMOS transistor, a source electrode is an input end, a drain electrode is an output end, and a gate electrode is a control end.

The voltage signal $V_{DACB}$ is input to a positive-phase input end of the operational amplifier 3 that serves as another input end of the current generation circuit 100. A negative-phase input end of the operational amplifier 3 is connected to a drain electrode of Mc, and the negative-phase input end is grounded using $R_B$. An output end of the operational amplifier 3 is connected to gate electrodes of Mc and Md, source electrodes of Mc and Md are connected to the power source $V_{DD}$, and a drain electrode of Md is connected to an input end of the current replication circuit.

The current replication circuit 103 is configured to reverse the current signal that is input at the input end, and a circuit structure of the current replication circuit 103 is a standard current mirroring circuit including switching transistors Me and Mf. A drain electrode of Me is an output end of a current mirror, source electrodes of both Me and Mf are connected to a ground terminal, gate electrodes of Me and Mf are connected to each other and connected to a drain electrode of Mf, and the drain electrode of Mf is an input end of the current mirror.

The following describes in detail an operating process of the superposition operation circuit with reference to the schematic circuit diagram shown in FIG. 5.

Assuming that an output of the operational amplifier 1 is $V_1$ and an amplification factor is A, a relationship between an input and an output of the operational amplifier 1 is $V_1 = A \times (V_S - V_1)$, that is, $V_1/V_S = A/(1+A)$. Because an order of magnitude of A is usually within 1000-10000, $V_1 \approx V_S$. To be specific, the output of the operational amplifier 1 changes with the input. In this case, the output of the operational amplifier 1 is always fixed at $V_S$, and therefore output precision is improved.

The operational amplifier 1 superposes a voltage signal output by the operational amplifier 1 on a voltage drop on the resistor $R_D$. The voltage drop on $R_D$ is generated after a current output by the current generation circuit 100 passes through $R_D$. If it is assumed that the current output by the current generation circuit 100 is $I_O$, after the output voltage of the operational amplifier 1 is superposed on the voltage drop on $R_D$, $V_O = V_S + R_D \times I_O$ is obtained at a $V_O$ end. It can be learned that the indirect current superposition manner is used in the operational amplifier 1, and a superposed current element is not directly generated by a DAC, but is obtained by the current generation circuit by converting a voltage signal generated by the DAC.

The output end of the operational amplifier 2 is connected to the gate electrode of Mb and is configured to control an output current $I_B$ of Mb. After the current $I_B$ passes through the resistor $R_A$, a voltage is generated and fed back to the negative-phase input end of the operational amplifier 2 to form a loop. According to a feature of an operational amplifier, on the premise that A>>1, voltages at the positive-phase end and the negative-phase end of the operational amplifier 2 are equal, that is, $V_A=V_{DACA}$. Similarly, $V_B=V_{DACB}$.

Ma and Mb have a same gate voltage and a same source voltage, and sizes of the two transistors are the same. Therefore, a current $I_A$ passing through Ma is equal to a current $I_B$ passing through Mb, that is, $I_A=I_B$. Similarly, $I_D=I_C$. Current directions of $I_A$, $I_B$, $I_C$, and $I_D$ are shown by directions of arrows in FIG. 5.

Me and Mf are a pair of simple standard current mirrors, and an output current $I_E$ of Me is equal to an input current $I_F$ of Mf ($I_F=I_E$). Current directions of $I_E$ and $I_F$ are shown by directions of arrows in FIG. 5.

Because Mf and Md are connected in series, $I_F=I_D$. In addition, because $I_D=I_C$, $I_F=I_C$. Therefore, a final current direction of a static current $I_O$ that is generated on Ma and Me and that flows to the resistor $R_D$ is from an upper end to a lower end of $R_D$, and $I_O$ is a difference between $I_A$ and $I_E$, that is, $I_O=I_A-I_E=I_A-I_F=I_B-I_C$.

On the premise that $V_A=V_{DACA}$, $V_B=V_{DACB}$, and $R_A=R_B=R$, $I_B=V_A/R$, and $I_C=V_B/R$. In this case, the output current $I_O$ is shown in Formula 2:

$$I_O = I_B - I_C = \frac{V_A - V_B}{R}. \quad \text{(Formula 2)}$$

A final output $V_O$ of the superposition operation circuit is shown in Formula 3:

$$V_O = V_S + R_D \cdot \frac{V_A - V_B}{R}. \quad \text{(Formula 3)}$$

It can be learned from Formula 2 and Formula 3 that when a proper R is selected and a range of ($V_A-V_B$) is adjusted, a voltage output can be superposed on the output $V_S$. When $$R_D = \frac{1}{N} \cdot R,$$

$V_O$ is equivalent to a value obtained by superposing $V_S$ on $$\frac{1}{N}$$

of an output voltage ($V_{DACA}-V_{DACB}$) of the voltage DAC. The coefficient N lowers a restriction on absolute precision of the voltage DAC, a voltage DAC with minimum precision of Err may be used, and a superposed voltage with equivalent minimum precision of Err/N is ultimately generated. After the superposition operation circuit calculates the voltage DAC, an equivalent current DAC is obtained. A minimum current I_LSB is determined by dividing a minimum V_LSB of the voltage DAC by R. Because no matching and power consumption compromise for a previous current DAC occurs between I_LSB and I_MSB, I_LSB may be minimized to an nA level.

According to the superposition operation circuit provided in this embodiment, an indirect current superposition manner is used, and an output voltage of a superposition operation amplifier is always fixed at a to-be-superposed analog element, and therefore output precision of the superposition operation circuit is improved. In addition, because a high-precision superposed current element is generated by a current generation circuit based on a low-precision voltage signal, but is not directly generated by a DAC, an input precision requirement for the current generation circuit is lowered, and then requirements for power consumption and an area of the current generation circuit are lowered.

Figure 6:
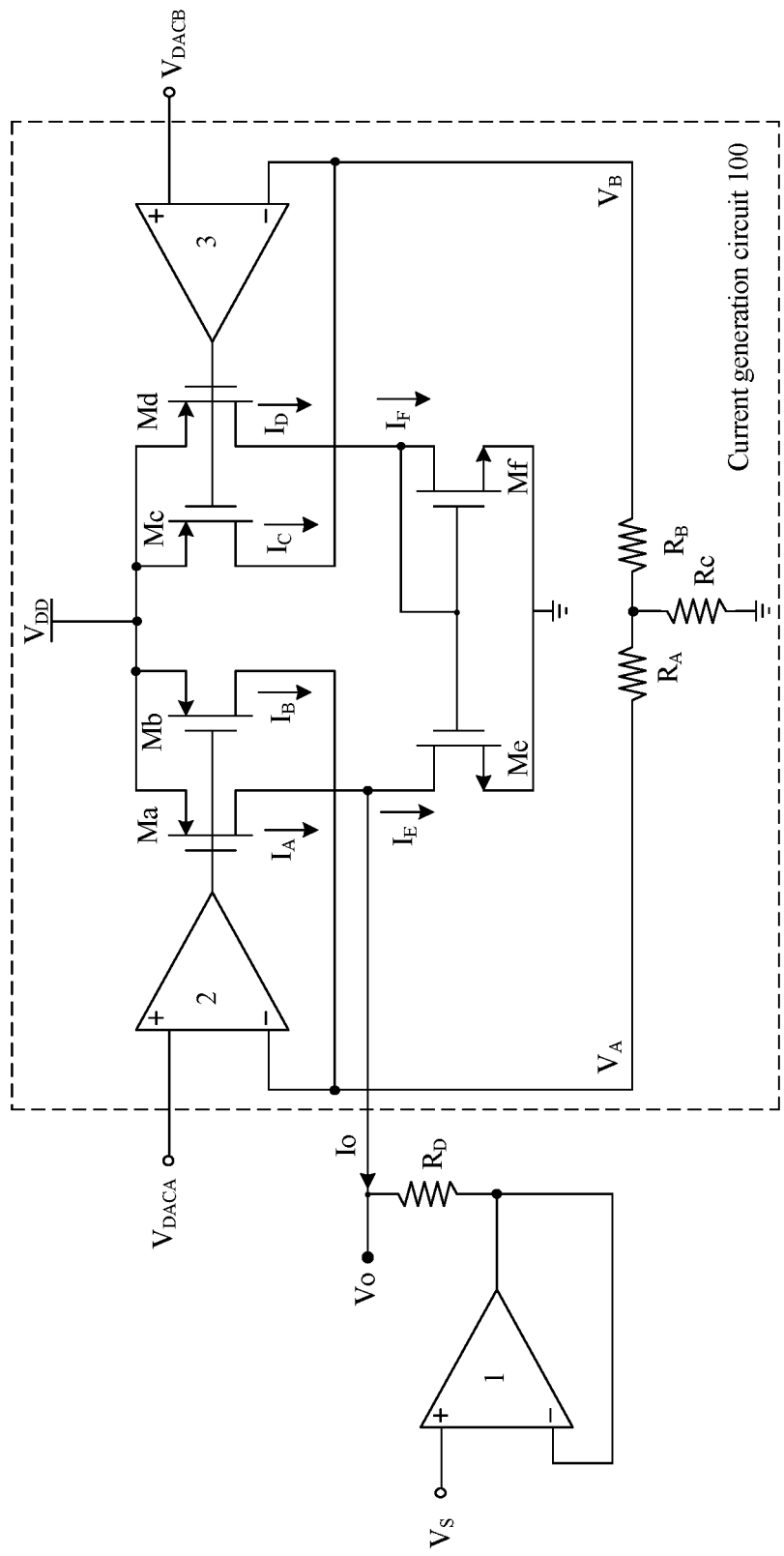
FIG. 6 is a schematic diagram of another superposition operation circuit according to an embodiment of this application.

FIG. 6 is a schematic diagram of another superposition operation circuit according to an embodiment of this application. As shown in FIG. 6, the superposition operation circuit provided in this embodiment includes an additional common-mode resistor $R_C$ in comparison with the superposition operation circuit shown in FIG. 5, and both $R_A$ and $R_B$ are connected to a ground terminal using R.

When $V_A=V_{DACA}$, $V_B=V_{DACB}$, $R_A=R_B=R_C=R$, resistance of the resistor $R_C$ is R, and a voltage on a connection terminal that is of the resistor $R_C$ and that is connected to the resistors $R_A$ and $R_B$ is $V_C$, $I_B$ and $I_C$ are shown in Formula 4 and Formula 5:

$$I_B = \frac{V_A - V_C}{R}; \text{ and} \quad \text{(Formula 4)}$$

$$I_C = \frac{V_B - V_C}{R}. \quad \text{(Formula 5)}$$

Therefore, an output current $I_O$ of a current generation circuit is still shown in Formula 2. It can be learned that after the common-mode resistor $R_C$ is introduced, $I_O$ does not change, but absolute values of $I_B$ and $I_C$ are reduced. Therefore, compared with a solution in which the common-mode resistor is not introduced, on the premise that a dynamic range of an output of the introduced common-mode resistor does not change, an absolute value of an operational current is reduced, power consumption of the operational current is reduced, and power consumption of the entire superposition operation circuit is further reduced.

Figure 7:
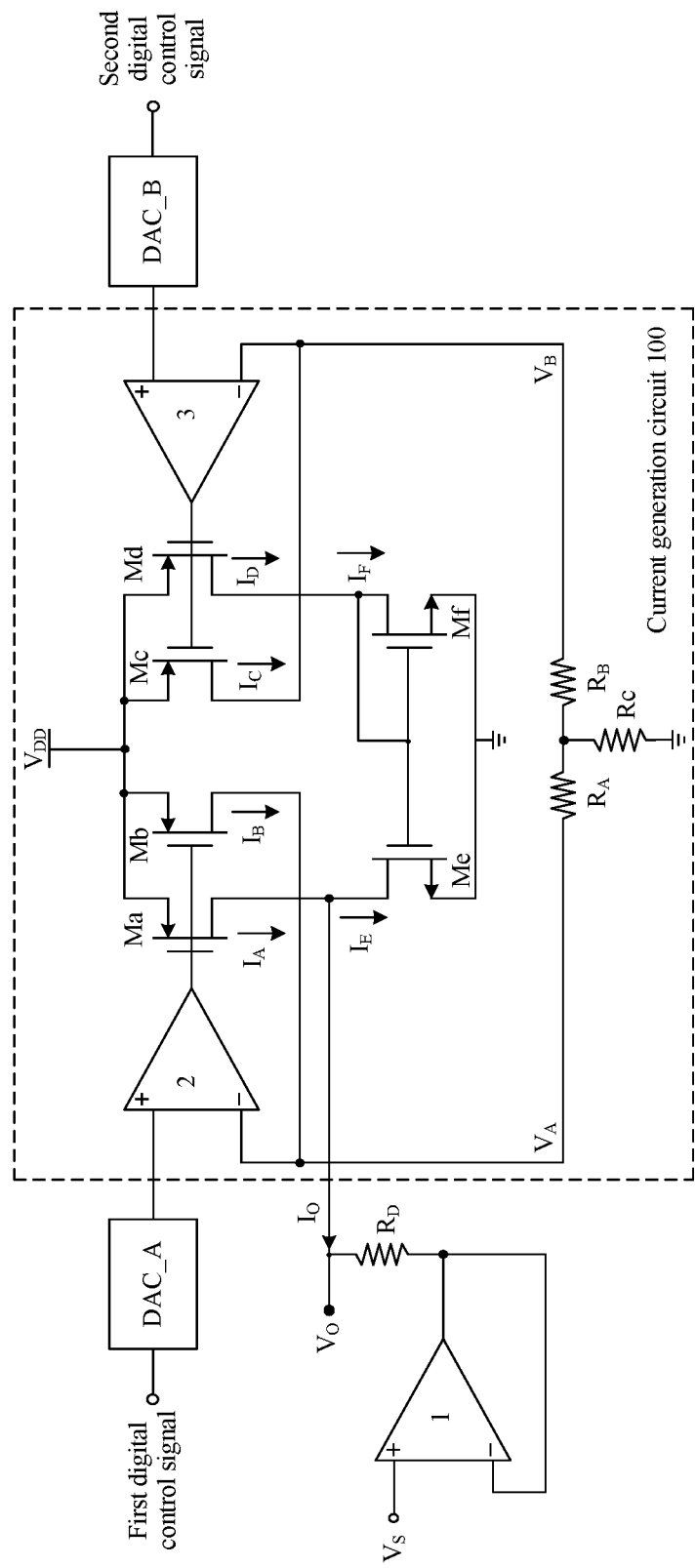
FIG. 7 is a schematic diagram of a float-voltage digital-to-analog conversion circuit according to an embodiment of this application.

FIG. 7 is a schematic diagram of a float-voltage DAC according to an embodiment of this application. The float-voltage DAC includes an additional DAC in comparison with the superposition operation circuit shown in FIG. 5 or FIG. 6, and a voltage signal output by the DAC is provided for the superposition operation circuit for a superposition operation such that a float voltage is output by the DAC.

In a possible implementation of this application, voltage signals $V_{DACA}$ and $V_{DACB}$ input to the superposition operation circuit are respectively generated by a digital-to-analog conversion circuit DAC_A (a first digital-to-analog conversion circuit) and a digital-to-analog conversion circuit DAC_B (a second digital-to-analog conversion circuit) based on digital control signals.

In another possible implementation of this application, voltage signals $V_{DACA}$ and $V_{DACB}$ may be generated by a same digital-to-analog conversion circuit based on one digital control signal.

From the technical content disclosed in the foregoing embodiments of the superposition operation circuit, it can be learned that, to implement voltage superposition with minimum precision of Err/N, in this embodiment, a high-precision current with minimum precision of Err/(N·R) is not directly generated by a current DAC, instead, a current generation circuit converts a voltage that is with minimum precision of Err and that is generated by a DAC, to a current with equivalent minimum precision of Err/(N·R) for superposition. In this way, requirements for matching precision (an area of a chip) and power consumption are lowered.

It should be noted that the embodiments in this specification are all described in a progressive manner, each embodiment focuses on a difference from other embodiments, and for same or similar parts in the embodiments, refer to these embodiments. An apparatus embodiment is basically similar to a method embodiment, and therefore is described briefly. For related parts, refer to some descriptions in the method embodiment.

Finally, it should be noted that in this specification, relational terms such as first and second are only used to distinguish one entity or operation from another, and do not necessarily require or imply that any actual relationship or sequence exists between these entities or operations. In addition, the terms "include", "comprise", or any other variant is intended to cover a non-exclusive inclusion such that a process, a method, an article, or a device that includes a list of elements not only includes those elements but also includes other elements that are not expressly listed, or further includes elements inherent to such a process, method, article, or device. An element preceded by "includes a . . . " does not, without more constraints, preclude the presence of additional identical elements in the process, method, article, or device that includes the element.

The embodiments disclosed above are described to enable a person skilled in the art to implement or use the present disclosure. Various modifications to the embodiments are obvious to a person skilled in the art, and general principles defined in this specification may be implemented in other embodiments without departing from the spirit or scope of the present disclosure. Therefore, the present disclosure is not be limited to the embodiments described in this specification but extends to the widest scope that complies with the principles and novelty disclosed in this specification.

The foregoing descriptions are merely optional implementations of the present disclosure. It should be noted that a person of ordinary skill in the art may make several improvements or polishing without departing from the principle of the present disclosure, and the improvements or polishing shall fall within the protection scope of the present disclosure.

What is claimed is:

1. A superposition operation circuit, comprising:
a first resister;
a current generation circuit configured to:
receive a first voltage signal using a first input end of the current generation circuit;
receive a second voltage signal using a second input end of the current generation circuit;
convert the first voltage signal to a first current signal;
convert the second voltage signal to a second current signal; and
output a current difference between the first current signal and the second current signal using an output end of the current generation circuit; and
a first operational amplifier coupled to the current generation circuit and configured to:
receive a to-be-superposed analog element using a positive-phase input end of the first operational amplifier, wherein a negative-phase input end of the first operational amplifier is coupled to an output end of the first operational amplifier, and wherein the output end of the first operational amplifier and the output end of the current generation circuit are coupled to each other using the first resistor; and
superpose the to-be-superposed analog element on a voltage drop on the first resistor.

2. The superposition operation circuit of claim 1, wherein the current generation circuit comprises:
a first voltage-to-current conversion circuit configured to:
receive the first voltage signal using a first voltage input end of the first voltage-to-current conversion circuit;
convert the first voltage signal to the first current signal; and
output the first current signal using a first current output end;
a second voltage-to-current conversion circuit configured to:
receive the second voltage signal using a second voltage input end of the second voltage-to-current conversion circuit;
convert the second voltage signal to the second current signal; and
output the second current signal using a second current output end; and
a current replication circuit, wherein an input end of the current replication circuit is coupled to the second current output end, wherein an output end of the current replication circuit is coupled to the first current output end, and wherein the current replication circuit is configured to:
reverse the second current signal to obtain a reversed second current signal; and
superpose the reversed second current signal on the first current signal to obtain the current difference.

3. The superposition operation circuit of claim 2, wherein the first voltage-to-current conversion circuit comprises:
a first switching transistor, wherein an output end of the first switching transistor is the same as an output end of the first voltage-to-current conversion circuit;
a second operational amplifier configured to receive the first voltage signal using a positive-phase input end of the second operational amplifier, wherein an output end of the second operational amplifier is coupled to a control end of the first switching transistor;
a second switching transistor, wherein a control end of the second switching transistor is coupled to the output end of the second operational amplifier, wherein an output end of the second switching transistor is coupled to a negative-phase input end of the second operational amplifier, and wherein an input end of the second switching transistor and an input end of the first switching transistor are coupled to a power source; and
a second resistor, wherein the negative-phase input end of the second operational amplifier is coupled to a ground terminal using the second resistor.

4. The superposition operation circuit of claim 3, wherein the second voltage-to-current conversion circuit comprises:
a third switching transistor;
a third operational amplifier configured to receive the second voltage signal using a positive-phase input end of the third operational amplifier, wherein an output end of the third operational amplifier is coupled to a control end of the third switching transistor, wherein a negative-phase input end of the third operational amplifier is coupled to an output end of the third switching transistor;

a third resistor, wherein the negative-phase input end of the third operational amplifier is coupled to the ground terminal using the third resistor; and a fourth switching transistor, wherein a control end of the fourth switching transistor is coupled to the output end of the third operational amplifier, wherein an output end of the fourth switching transistor is the same as an output end of the second voltage-to-current conversion circuit, and wherein an input end of the fourth switching transistor and an input end of the third switching transistor are coupled to the power source.

5. The superposition operation circuit of claim 4, wherein the current generation circuit further comprises a common-mode resistor, wherein the negative-phase input end of the second operational amplifier is coupled to a first end of the common-mode resistor using the second resistor, wherein a second end of the common-mode resistor is coupled to the ground terminal, and wherein the negative-phase input end of the third operational amplifier is coupled to the first end of the common-mode resistor using the third resistor.

6. The superposition operation circuit of claim 4, wherein both the third switching transistor and the fourth switching transistor are P-type metal-oxide-semiconductor field-effect (MOSFET) transistors.

7. The superposition operation circuit of claim 3, wherein both the first switching transistor and the second switching transistor are P-type metal-oxide-semiconductor field-effect (MOSFET) transistors.

8. The superposition operation circuit of claim 2, wherein the current replication circuit is a standard current mirroring circuit, wherein the current replication circuit comprises a fifth switching transistor and a sixth switching transistor, wherein a control end of the fifth switching transistor is coupled to a control end of the sixth switching transistor, wherein an output end of the fifth switching transistor and an output end of the sixth switching transistor are coupled to a ground terminal, wherein an input end of the fifth switching transistor is coupled to the control end of the fifth switching transistor, wherein the input end of the fifth switching transistor is the same as the input end of the current replication circuit, and wherein an input end of the sixth switching transistor is the same as the output end of the current replication circuit.

9. The superposition operation circuit of claim 8, wherein both the fifth switching transistor and the sixth switching transistor are N-type metal-oxide-semiconductor field-effect (MOSFET) transistors.

10. A float-voltage digital-to-analog conversion circuit, comprising:
a superposition operation circuit, comprising:
a first resister;
a current generation circuit configured to:
receive a first voltage signal using a first input end of the current generation circuit;
receive a second voltage signal using a second input end of the current generation circuit;
convert the first voltage signal to a first current signal;
convert the second voltage signal to a second current signal; and
output a current difference between the first current signal and the second current signal using an output end of the current generation circuit; and a first operational amplifier coupled to the current generation circuit and configured to:
receive a to-be-superposed analog element using a positive-phase input end of the first operational amplifier, wherein a negative-phase input end of the first operational amplifier is coupled to an output end of the first operational amplifier, and wherein the output end of the first operational amplifier and the output end of the current generation circuit are coupled to each other using the first resistor; and
superpose the to-be-superposed analog element on a voltage drop on the first resistor; and
a digital-to-analog conversion circuit configured to:
receive a digital control signal using an input end of the digital-to-analog conversion circuit, wherein a first output end of the digital-to-analog conversion circuit is coupled to the first input end of the current generation circuit, and wherein a second output end of the digital-to-analog conversion circuit is coupled to the second input end of the current generation circuit;
convert the digital control signal to the first voltage signal and the second voltage signal;
output the first voltage signal using the first output end of the digital-to-analog conversion circuit; and
output the second voltage signal using the second output end of the digital-to-analog conversion circuit.

11. The float-voltage digital-to-analog conversion circuit of claim 10, wherein the current generation circuit comprises:
a first voltage-to-current conversion circuit configured to:
receive the first voltage signal using a first voltage input end of the first voltage-to-current conversion circuit;
convert the first voltage signal to the first current signal; and
output the first current signal using a first current output end;
a second voltage-to-current conversion circuit configured to:
receive the second voltage signal using a second voltage input end of the second voltage-to-current conversion circuit;
convert the second voltage signal to the second current signal; and
output the second current signal using a second current output end; and
a current replication circuit, wherein an input end of the current replication circuit is coupled to the second current output end, wherein an output end of the current replication circuit is coupled to the first current output end, and wherein the current replication circuit is configured to:
reverse the second current signal to obtain a reversed second current signal; and
superpose the reversed second current signal on the first current signal to obtain the current difference.

12. The superposition operation circuit of claim 11, wherein the first voltage-to-current conversion circuit comprises:
a first switching transistor, wherein an output end of the first switching transistor is the same as an output end of the first voltage-to-current conversion circuit;
a second operational amplifier configured to receive the first voltage signal using a positive-phase input end of the second operational amplifier, wherein an output end of the second operational amplifier is coupled to a control end of the first switching transistor;
a second switching transistor, wherein a control end of the second switching transistor is coupled to the output end of the second operational amplifier, wherein an output end of the second switching transistor is coupled to a negative-phase input end of the second operational amplifier, and wherein an input end of the second switching transistor and an input end of the first switching transistor are coupled to a power source; and
a second resistor, wherein the negative-phase input end of the second operational amplifier is coupled to a ground terminal using the second resistor.

13. The float-voltage digital-to-analog conversion circuit of claim 12, wherein the second voltage-to-current conversion circuit comprises:
a third switching transistor;
a third operational amplifier configured to receive the second voltage signal using a positive-phase input end of the third operational amplifier, wherein an output end of the third operational amplifier is coupled to a control end of the third switching transistor, wherein a negative-phase input end of the third operational amplifier is coupled to an output end of the third switching transistor;
a third resistor, wherein the negative-phase input end of the third operational amplifier is coupled to the ground terminal using the third resistor; and
a fourth switching transistor, wherein a control end of the fourth switching transistor is coupled to the output end of the third operational amplifier, wherein an output end of the fourth switching transistor is the same as an output end of the second voltage-to-current conversion circuit, and wherein an input end of the fourth switching transistor and an input end of the third switching transistor are coupled to the power source.

14. The float-voltage digital-to-analog conversion circuit of claim 13, wherein the current generation circuit further comprises a common-mode resistor, wherein the negative-phase input end of the second operational amplifier is coupled to a first end of the common-mode resistor using the second resistor, wherein a second end of the common-mode resistor is coupled to the ground terminal, and wherein the negative-phase input end of the third operational amplifier is coupled to the first end of the common-mode resistor using the third resistor.

15. The float-voltage digital-to-analog conversion circuit of claim 13, wherein the third switching transistor is a P-type metal-oxide-semiconductor field-effect (MOSFET) transistors.

16. The float-voltage digital-to-analog conversion circuit of claim 13, wherein the fourth switching transistor is a P-type metal-oxide-semiconductor field-effect (MOSFET) transistors.

17. The float-voltage digital-to-analog conversion circuit of claim 12, wherein the first switching transistor is a P-type metal-oxide-semiconductor field-effect (MOSFET) transistor.

18. The float-voltage digital-to-analog conversion circuit of claim 12, wherein the second switching transistor is a P-type metal-oxide-semiconductor field-effect (MOSFET) transistor.

19. The float-voltage digital-to-analog conversion circuit of claim 11, wherein the current replication circuit is a standard current mirroring circuit, wherein the current replication circuit comprises a fifth switching transistor and a sixth switching transistor, wherein a control end of the fifth switching transistor is coupled to a control end of the sixth switching transistor, wherein an output end of the fifth switching transistor and an output end of the sixth switching transistor are coupled to a ground terminal, wherein an input end of the fifth switching transistor is coupled to the control end of the fifth switching transistor, wherein the input end of the fifth switching transistor is the same as the input end of the current replication circuit, and wherein an input end of the sixth switching transistor is the same as the output end of the current replication circuit.

20. The float-voltage digital-to-analog conversion circuit of claim 17, wherein both the fifth switching transistor and the sixth switching transistor are N-type metal-oxide-semiconductor field-effect (MOSFET) transistors.

* * * * *